(12) United States Patent
Kim et al.

(10) Patent No.: US 6,232,133 B1
(45) Date of Patent: May 15, 2001

(54) METHOD FOR FABRICATING A CAPACITOR OF SEMICONDUCTOR MEMORY DEVICE

(75) Inventors: Nam-Kyeong Kim; Kwang-Jun Cho, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/447,672

(22) Filed: Nov. 23, 1999

(30) Foreign Application Priority Data

Dec. 30, 1998 (KR) .................................................. 98-61099

(51) Int. Cl.$^7$ ...................................................... H01G 7/06
(52) U.S. Cl. .................................................. 438/3; 438/240
(58) Field of Search ........................ 438/3, 240, 253–256, 438/390–398

(56) References Cited

U.S. PATENT DOCUMENTS

| | | | |
|---|---|---|---|
| 5,423,285 | * 6/1995 | Paz De Araujo et al. | ............. 117/90 |
| 5,426,075 | 6/1995 | Perino et al. | . |
| 5,519,566 | 5/1996 | Perino et al. | . |
| 5,524,092 | * 6/1996 | Park | ...................................... 365/145 |
| 5,601,869 | * 2/1997 | Scott | ................................ 427/126.3 |
| 5,790,366 | * 8/1998 | Desu et al. | ............................ 361/305 |
| 5,807,774 | * 9/1998 | Desu et al. | ............................ 438/240 |
| 5,877,062 | 3/1999 | Horii | . |
| 5,902,131 | 5/1999 | Argos et al. | . |
| 5,912,486 | * 6/1999 | Summerfelt | .......................... 257/310 |

FOREIGN PATENT DOCUMENTS

| | | |
|---|---|---|
| 5-152962 | 6/1993 | (JP) . |
| 10-172298 | 6/1998 | (JP) . |
| 10-189886 | 7/1998 | (JP) . |

* cited by examiner

Primary Examiner—Jey Tsai
(74) Attorney, Agent, or Firm—Jacobson, Price, Holman & Stern, PLLC

(57) ABSTRACT

There is provided a method for fabricating a capacitor of semiconductor memory device, which can prevent Ti from diffusing into the ferroelectric layer of capacitor from the Ti adhesive layer, which is formed at the time of metal wiring to decrease the contact resistance between the upper electrode of capacitor and the metal wire. In order to prevent diffusion of Ti into the inside of the capacitor, a dense oxide layer is formed on the ferroelectric layer such as SBTN.

12 Claims, 3 Drawing Sheets

METHOD FOR FABRICATING A CAPACITOR OF SEMICONDUCTOR MEMORY DEVICE

FIELD OF THE INVENTION

The present invention relates to a field on fabrication of semiconductor device; and, more particularly, to a method for fabricating a capacitor of semiconductor memory device, which can effectively prevent Ti from diffusing into the ferroelectric layer of capacitor from a Ti adhesive layer, which is formed at the time of metal wiring to decrease the contact resistance between the upper electrode of capacitor and the metal wire.

DESCRIPTION OF THE PRIOR ART

As a non-volatile memory device, A ferroelectric memory device memorizes its stored information even at the time of cutting off power supply and equals to the conventional Dynamic Random Access Memory (DRAM) in view of operating speed. Thus, it is promising as a future generation memory device. Dielectric material of the ferroelectric memory device includes $Sr_xBi_yTa_2O_9$ (hereinafter, referred as SBT), $Sr_xBi_y(Ta_{1-z}Nb_z)_2O_9$ (hereinafter, referred as SBTN), $Pb(Zr_xTi_{1-x})O_3$ (hereinafter, referred as PZT). To allow such ferroelectric layer to have excellent ferroelectric characteristics, it is essential to select suitable upper and lower electrodes and to control processes.

Particularly, Ti is used to decrease the contact resistance between the upper electrode of capacitor and metal wire, which connects the upper electrode to a substrate. But, in the case of high integration, the Ti penetrates through the upper electrode and piles up at the boundary between the upper electrode and the ferroelectric layer such as SBTN or SBT. The piled Ti diffuses into a crystalline grain, dipole regions, the boundary between dipole regions and the like in the subsequent thermal treatment. The diffused Ti exists as single element or reacts with oxygen to form fine oxide. Thus, the Ti or Ti oxide plays a role of defect. The defects in the crystalline grains, dipole regions and the boundary between dipole regions prevent polarization to show low polarization characteristics and serve as a path of leakage current rapidly to deteriorate electric characteristics. The Ti also substitutes the Ta or Nb site composed in the layered perovskite structure to break the structure or to deform the structure. This generates polarization fatigue, which rapidly decreases the value of polarization with high frequency applied from the outside.

SUMMARY OF THE INVENTION

It is, therefore, an object of the present invention to provide a method for fabricating a capacitor of semiconductor memory device, which can effectively prevent Ti from diffusing into the ferroelectric layer of capacitor through the upper electrode from the Ti layer used as adhesive layer of metal wire.

In accordance with an embodiment of the present invention, there is provided a method for fabricating a capacitor of semiconductor memory device, which comprises the steps of forming a lower electrode of capacitor; forming a ferroelectric layer on the lower electrode; forming an oxide layer as a diffuse barrier on the ferroelectric layer; and forming an upper layer on the oxide layer.

The present invention is characterized in that in order to suppress diffusion of Ti from the Ti adhesive layer formed at the time of metal wire formation process into the inside of the capacitor, a dense oxide layer is formed on the ferroelectric layer such as SBTN or SBT.

The oxide used in the oxide layer of the present invention is preferably the oxide of Ta, or the complex oxide of Ta and Nb. The present invention uses as the Ti barrier oxide, the Ta oxide or Ta/Nb complex oxide, and Ta, Nb and oxygen atoms are the ingredients of STBN or STB used as ferroelectric in the present invention. Thus, the oxide layer used in the present invention can not deteriorate the ferroelectric layer at the subsequent thermal processes although the ingredients of the oxide layer will diffuse into the ferroelectric layer. The ratio of the Ta/Nb complex oxide is preferably in the range of 10:0 and 5:5, more preferably in the range of 10:0 and 7:3, most preferably 7:3. In case that the conditions of the subsequent thermal processes are severe, it is recommended that the ratio of the Ta/Nb oxide is in the range of 10:0 and 7:3, particularly, 7:3 for SBTN.

For example, a dense Ta—Nb oxide layer is formed with a thickness less than 700 Å on the ferroelectric layer. The thickness of the oxide is preferable to be thinner. But, when it is 50 Å below, Ti may penetrate through the oxide layer to the ferroelectric layer. Therefore, the thickness should be 50 Å over. For example, the oxide layer may be formed by the following methods or the like.

The first method comprises performing deposition process with sputtering using Ta—Nb target and performing oxidation process at furnace of oxygen atmosphere. The second method comprises performing spin-on process using metal organic reagent including Ta and Nb and performing nucleus generation and crystal growing process or processes. The third method is to form the oxide layer by chemical vapor deposition using the metal organic source(s). The forth method is to form the oxide layer by low temperature oxidation using plasma activation energy and various reaction gases.

In the present invention, the oxide layer becomes denser by addition of furnace annealing or rapid thermal annealing (RTA) which sufficiently oxidize the layer. Here, the furnace annealing is performed at a temperature of 500° C. to 800° C. The RTA is performed at a temperature of 600° C. to 1100° C.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

The invention will be illustrated in detail by the following preferred embodiments with reference to the accompanying drawings.

Figure 1:
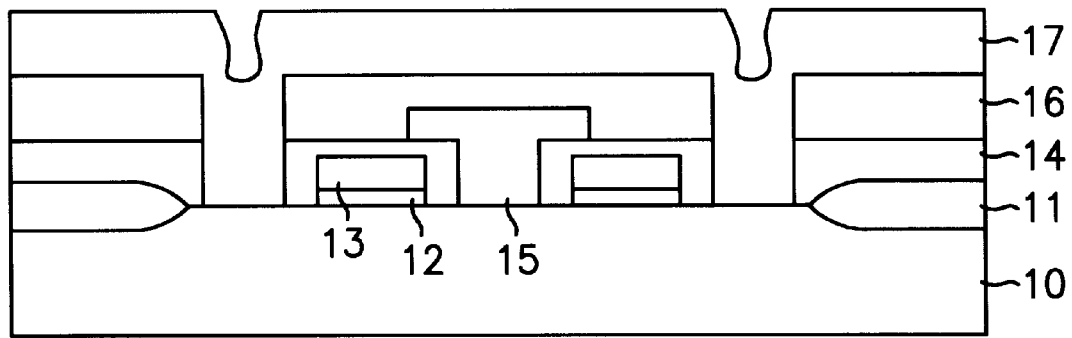
FIGS. 1 to 5 are sectional views showing the processes for a capacitor of semiconductor memory device in accordance with one embodiment of the present invention.

Referring to FIG. 1, an interlayer insulating layer 16 is formed over a semiconductor substrate formed predetermined word lines and bit lines. The interlayer insulating layers 14 and 16 are then selectively etched to form contact holes, which open the connections of transistor (not shown). A polysilicon layer 17 is then formed over the entire structure. In this drawing, numeral 11 represents an element isolation film. Numeral 12 does a gate oxide film. Numeral 15 does a bit line.

Figure 2:
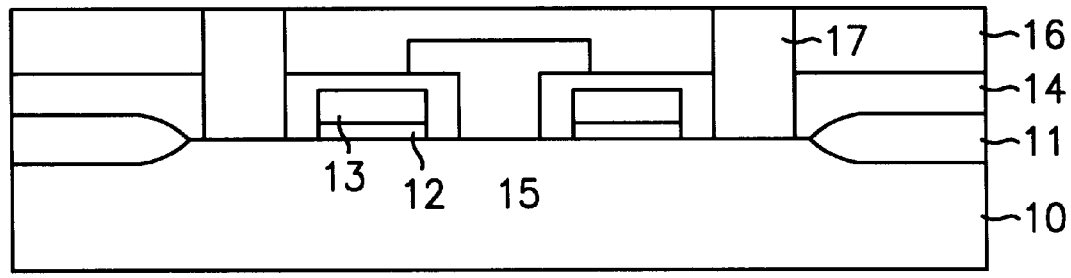

Next, referring to FIG. 2, the polysilicon layer 17 is flattened by chemical mechanical polishing until the interlayer insulating layer 16 is opened. At this time, a plug of polysilicon layer 17 is formed within the contact hole.

Figure 3:
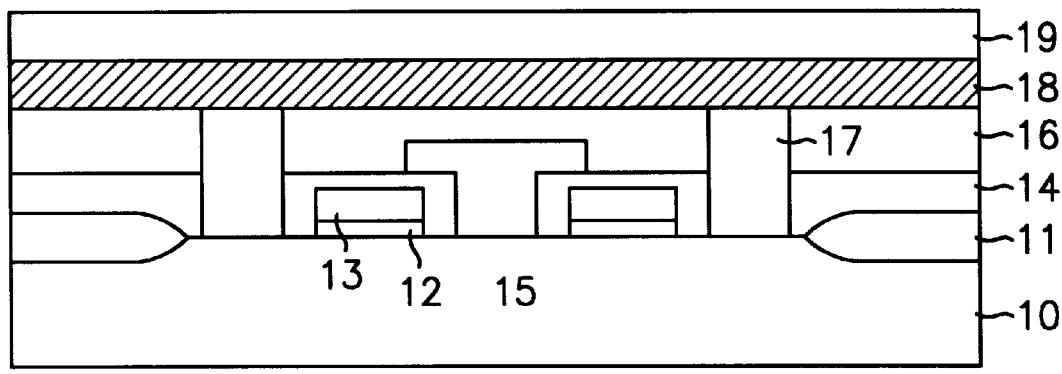

Subsequently, referring to FIG. 3, a Pt lower electrode 18 is formed over the entire structure. A ferroelectric layer 19 such as SBTN ($Sr_xBi_y(Ta_{1-z}Nb_z)_2O_9$) or SBT ($Sr_xBi_yTa_2O_9$) is then formed on the Pt lower electrode 18. In the $Sr_xBi_y(Ta_{1-zNbz})_2O_9$ or $Sr_xBi_yTa_2O_9$, x is 0.6 to 1.0, y is 1.5 to 2.5, and z is 0 to 0.5. Here, the ferroelectric layer 19 is formed using various deposition methods such as spin-on, sputtering, chemical vapor deposition (CVD) and liquid source mixed chemical deposition (LSMCD). When the SBTN or SBT layer is formed using the spin-on method, the nuclei of SBTN or SBT are formed using RTA and the crystalline grains are grown by subsequent high temperature thermal process. When the SBTN or SBT layer is formed using the sputtering method, the material is deposited at room temperature in order to maintain the composition of the material. Then, RTA performs crystalline growth to a certain size at a temperature of 800° C. to 1000° C. for 10 seconds to 20 seconds. The subsequent high temperature thermal process then grows the material to crystalline grain. When the SBTN layer is formed with CVD method, the doping concentration of Nb is allowed to be 20% to 30%, and the layer is formed in the plasma activation state with injection of reaction source containing $O_2$, $H_2O$, $N_2O$ and $H_2O_2$. Here, in order to provide thermal energy needed to the reaction, the deposition is performed at a temperature of 350° C. to 700° C. The nuclei are formed at lower temperature and the crystalline grains are formed at higher temperature by subsequent high temperature thermal process.

Figure 4:
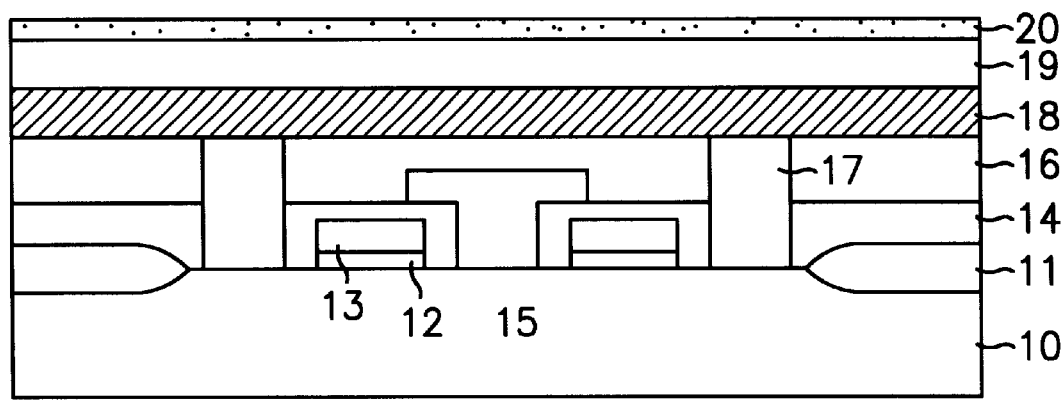

Next, referring to FIG. 4, for example, a Ta—Nb oxide layer 20 is formed on the ferroelectric layer 19 using various deposition methods. Preferably, the ratio of Ta and Nb in the Ta—Nb oxide layer 20 is allowed to be about 7:3. The Ta—Nb oxide layer 20 can be formed with sputtering, spin-on, CVD or plasma enhanced chemical vapor deposition (PECVD) method. When the Ta—Nb oxide layer 20 is formed with sputtering method, Ta—Nb target is used. In the case of spin-on method, liquid source is used. The ratio of Ta and Nb in the liquid source is preferably about 7:3. In the synthesis of the liquid source, octane is used as solvent to dissolve or suspend the starting material, metal powder. N-butyl acetate is also used as stabilizer of the metal material dissolved or suspended in the octane. When the Ta—Nb oxide layer 20 is formed with CVD method, the oxide layer is deposited with a thickness less than 700 Å, more preferably with a thickness of 100 Å to 300 Å using $O_2$ or $N_2O$ gas at 400° C. to 600° C. In the case of PECVD, low power of 80 W to 1 kW is applied at 350° C. to 600° C. and $N_2O$ or $O_2$ gas is used. The supplied power is preferably 80 W to 200 W. The Nb—Ta oxide layer 20 is formed with a thickness less than 700 Å, more preferably with a thickness of 100 Å to 300 Å.

Subsequently, furnace annealing or RTA is performed at a temperature of 500° C. to 800° C. or a temperature of 600° C. to 1100° C., respectively, to allow the Nb—Ta oxide layer to be dense.

Figure 5:
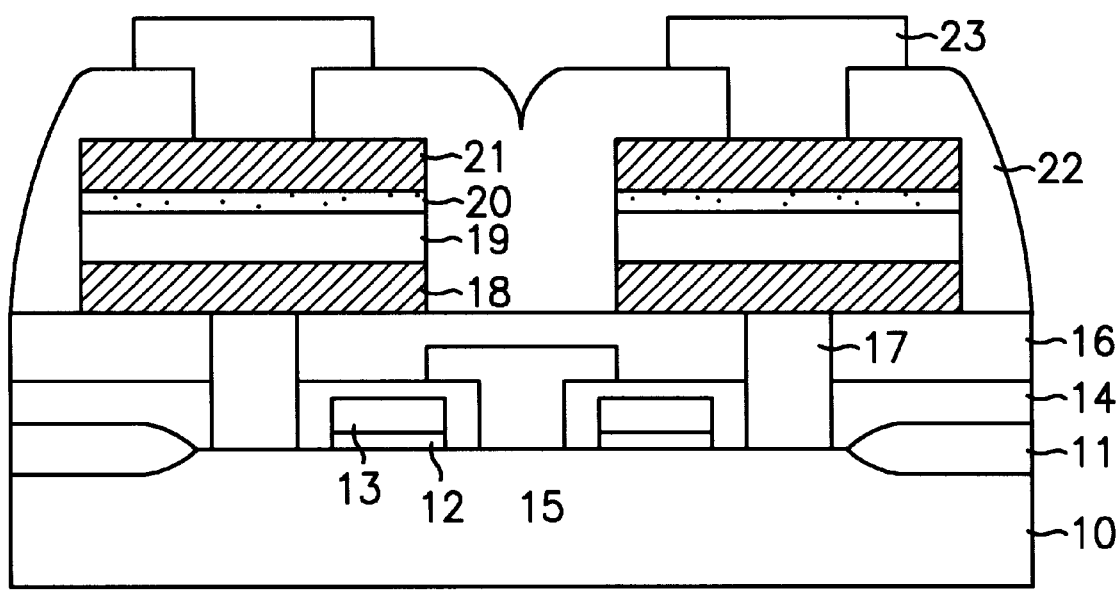

Next, referring to FIG. 5, a Pt upper electrode 21 is formed on the Ta—Nb oxide layer 20 to make metal ferroelectric metal (MEM) structure. Then, the Pt upper electrode 21, the Ta—Nb oxide layer 20, the ferroelectric layer 19 and the Pt lower electrode 18 are selectively etched to form the capacitor structure. A capping oxide layer 22 such as $SiO_2$ is then formed over the entire structure, and the capping oxide layer 22 is selectively etched to open the Pt upper electrode 21. Then, a metal wire 23 is formed to connect with the Pt upper electrode 21 through the contact hole.

While the present invention has been described with respect to certain preferred embodiment only, other modifications and variations may be made without departing from the spirit and scope of the present invention as set forth in the following claims.

What is claimed is:

1. A method for fabricating a capacitor of semiconductor device, which comprises the steps of:

forming a lower electrode of capacitor;

forming a ferroelectric layer on the lower electrode;

forming an oxide layer as a diffusion barrier on the ferroelectric layer; and forming an upper electrode on the oxide layer, wherein the ferroelectric layer is formed with $Sr_xBi_y(Ta_{1-z}NB_z)_2O_9$ and the oxide layer is formed with Ta/Nb containing oxide.

2. The method according to claim 1, wherein the ratio of Ta and Nb in the oxide is in the range between 10:0 and 5:5.

3. The method according to claim 2, wherein the oxide layer is formed by a sputtering method.

4. The method according to claim 2, wherein the oxide layer is formed with spin on method, wherein octane is used as solvent and N-butyl acetate is used as stabilizer in the source solution containing the metal(s).

5. The method according to claim 2, wherein the oxide layer is formed with chemical vapor deposition method using $O_2$ or $N_2O$ gas at a temperature of 400° C. to 600° C.

6. The method according to claim 2, wherein the oxide layer is formed with chemical vapor deposition method using $O_2$ or $N_2O$ gas at 350° C. to 600° C.

7. The method according to claim 1, wherein after the oxide layer is formed, the method further comprises performing furnace annealing or rapid thermal annealing in order to make the oxide layer structure dense.

8. The method according to claim 7, wherein the ratio of Ta and Nb in the oxide is in the range between 10:0 and 5:5.

9. The method according to claim 8, wherein the oxide layer is formed with sputtering method.

10. The method according to claim 8, wherein the oxide layer is formed with spin on method, wherein octane is used as solvent and N-butyl acetate is used as stabilizer in the source solution containing the metal(s).

11. The method according to claim 8, wherein the oxide layer is formed with chemical vapor deposition method using $O_2$ or $N_2O$ gas at a temperature of 400° C. to 600° C.

12. The method according to claim 8, wherein the oxide layer is formed with chemical vapor deposition method using $O_2$ or $N_2O$ gas at 350° C. to 600° C.

* * * * *